United States Patent
Zhang et al.

(10) Patent No.: US 9,614,041 B1
(45) Date of Patent: Apr. 4, 2017

(54) MULTI-GATE SEMICONDUCTOR DEVICES WITH IMPROVED HOT-CARRIER INJECTION IMMUNITY

(71) Applicant: Freescale Semiconductor Inc., Austin, TX (US)

(72) Inventors: Zhihong Zhang, Chandler, AZ (US); Hongning Yang, Chandler, AZ (US); Jiang-Kai Zuo, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/851,877

(22) Filed: Sep. 11, 2015

(51) Int. Cl.
   *H01L 29/78* (2006.01)
   *H01L 29/10* (2006.01)
   *H01L 29/66* (2006.01)

(52) U.S. Cl.
   CPC .... *H01L 29/1083* (2013.01); *H01L 29/66484* (2013.01); *H01L 29/66492* (2013.01); *H01L 29/7831* (2013.01); *H01L 29/7835* (2013.01)

(58) Field of Classification Search
   CPC ........... H01L 29/1083; H01L 29/66484; H01L 29/7831; H01L 29/7835; H01L 29/66492
   See application file for complete search history.

(56) References Cited

U.S. PATENT DOCUMENTS

| | | | |
|---|---|---|---|
| 4,746,624 A * | 5/1988 | Cham | H01L 21/0337 257/408 |
| 7,329,922 B2 | 2/2008 | Shibib et al. | |
| 8,227,861 B2 | 7/2012 | Yang et al. | |
| 2005/0258478 A1* | 11/2005 | Hokomoto | H01L 27/088 257/328 |
| 2007/0262390 A1* | 11/2007 | Ishida | H01L 27/088 257/368 |
| 2008/0079078 A1* | 4/2008 | Noguchi | H01L 29/7804 257/355 |
| 2008/0079079 A1* | 4/2008 | Noguchi | H01L 27/0255 257/355 |
| 2008/0121997 A1* | 5/2008 | Yang | H01L 29/1041 257/365 |
| 2008/0182394 A1* | 7/2008 | Yang | H01L 29/7835 438/510 |
| 2010/0219417 A1* | 9/2010 | Miura | H01L 29/0615 257/77 |
| 2011/0089500 A1* | 4/2011 | Yang | H01L 29/1041 257/408 |
| 2011/0260247 A1* | 10/2011 | Yang | H01L 29/0653 257/343 |

(Continued)

*Primary Examiner* — Earl Taylor
*Assistant Examiner* — Samuel Park

(57) ABSTRACT

A semiconductor device includes a substrate having a first dopant type, a first gate electrode and second gate electrode formed over the substrate and spatially separated from each other, a first region of a second dopant type, having a pocket of the first dopant type, formed in the substrate between the first and second gate electrodes, the pocket being spaced apart from the first and second gate electrodes, a silicide block over the first region, a source region formed in the substrate on an opposing side of the first gate electrode from the first region and having the second dopant type, a drain region formed in the substrate on an opposing side of the second gate electrode from the first region, the drain region having the second dopant type, and a second pocket of the first dopant type formed in the drain region adjacent to the second gate electrode.

16 Claims, 5 Drawing Sheets

(56) References Cited

U.S. PATENT DOCUMENTS

| | | | | |
|---|---|---|---|---|
| 2011/0284874 A1* | 11/2011 | Miura | ................ | H01L 29/4916 |
| | | | | 257/77 |
| 2012/0175679 A1* | 7/2012 | Marino | ................ | H01L 29/402 |
| | | | | 257/194 |
| 2013/0026569 A1* | 1/2013 | Hao | ................ | H01L 21/2253 |
| | | | | 257/344 |
| 2013/0270635 A1* | 10/2013 | Parris | ................ | H01L 29/66659 |
| | | | | 257/336 |
| 2014/0001545 A1* | 1/2014 | Yang | ................ | H01L 29/66689 |
| | | | | 257/337 |
| 2014/0027849 A1* | 1/2014 | Yang | ................ | H01L 29/402 |
| | | | | 257/343 |
| 2014/0054694 A1* | 2/2014 | Min | ................ | H01L 29/66659 |
| | | | | 257/336 |
| 2014/0070311 A1* | 3/2014 | Yang | ................ | H01L 29/66689 |
| | | | | 257/335 |
| 2014/0070312 A1* | 3/2014 | Yang | ................ | H01L 29/66681 |
| | | | | 257/337 |

\* cited by examiner

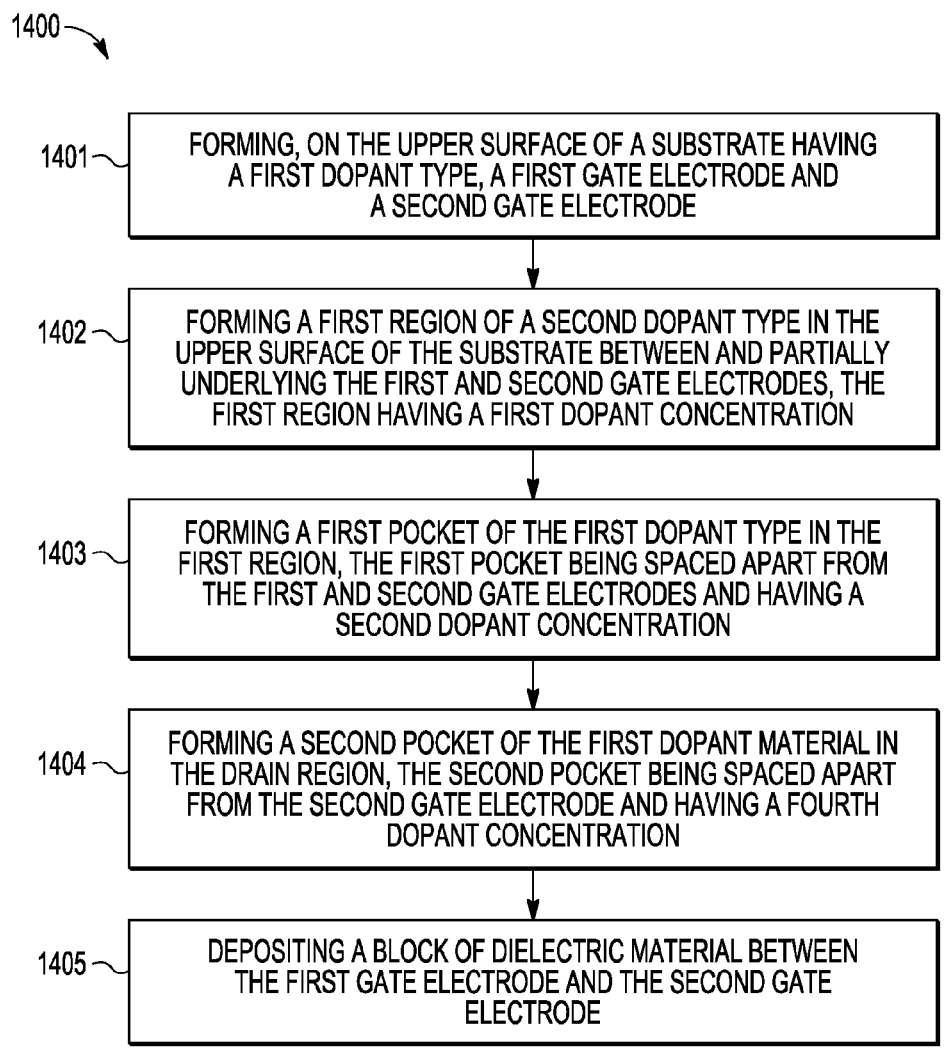

MULTI-GATE SEMICONDUCTOR DEVICES WITH IMPROVED HOT-CARRIER INJECTION IMMUNITY

FIELD

The device and methods disclosed herein relate generally to a semiconductor device and a method for forming a semiconductor device, and more specifically to multi-gate semiconductor devices with improved hot carrier injection immunity.

BACKGROUND

Integrated circuits are formed on semiconductor substrates, or wafers. The wafers are then sawed into microelectronic dies (or "dice"), or semiconductor chips, with each die carrying a respective integrated circuit. Each semiconductor chip is mounted to a package, or carrier substrate, which is often mounted to a motherboard and installed in various electronic systems.

In recent years, integrated circuits have become more complicated both in terms of packing density and the variety of device components that are included in a single circuit. As the productivity and performance demands increase, the size of integrated circuits, as well as the semiconductor chips on which they are formed, continues to be reduced. As the individual devices (e.g., transistors) within the integrated circuits become smaller, integrated circuit designers and manufacturers must constantly overcome various natural phenomena and limitations due to the design of, as well as the processing steps used to form, the integrated circuits.

One such phenomenon is known as "hot carrier injection" (HCI). HCI occurs when electrons, or holes, are accelerated by a strong electric field and gain very high kinetic energies within a semiconductor device. The high kinetic energies cause impact ionization on the semiconductor lattice to generate pairs of electrons and holes moving in random directions with high kinetic energies, which are called "hot carriers." Some of the hot carriers are injected and trapped in a dielectric within the device, (e.g. the gate oxide or silicide block material), where they form an undesirable space charge, which can cause device degradation and/or instability.

One current approach for minimizing HCI includes forming an "extended drain", (i.e. a lightly-doped drift region between the channel under the gate and the drain outside the gate). However, such structures are not compatible with current submicron processing techniques. More recently, extended drains have been incorporated by forming a silicide block between the gate and the drain with a self-aligned implantation to form the lightly-doped drift region. However, even with low electric fields, the device with silicide block experiences significant HCI damage, and the charge trapped within the silicide block material causes significant transconductance degradation, as well as the linear current degradation. To improve the performance of an extended drain device, the doping within the drift region must be extremely low, which increases the parasitic resistance of the device. The problems associated with HCI are exacerbated as devices continue to get smaller while maintaining relatively high operational voltages, (e.g. approximately 6 V). Because of the problems caused by HCI, conventional device designs, such as those incorporating the extended drains using silicide blocks, may not perform adequately while incorporating the latest submicron (e.g. 0.13 micron) technology platforms. Moreover, in highly miniaturized semiconductors, conventional approaches also fail to produce a sufficient safe operating area for many applications.

Accordingly, it is desirable to provide a semiconductor device with improved HCI immunity. In addition, it is desirable to provide a semiconductor device a broad safe operating area at a miniature size. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIGS. 12 and 13 are circuit diagrams of the semiconductor device of FIG. 11.

FIG. 14 is a flow diagram illustrating a method for manufacturing a semiconductor device.

DETAILED DESCRIPTION

Embodiments of the inventive subject matter include multi-gate semiconductor devices having a channel carrier type and pockets of the opposite carrier type between the gates and on the drain side of the gates. As shown in further detail below, the resulting device may produce an additional depletion region, with the result that the maximal electric field at the drain-side of the semiconductor device may be reduced, improving HCI immunity even at small sizes and relatively high drain voltage (e.g. approximately 6V). The pockets may also reduce blocking-state drain-side gate edge voltages, improving accumulation mode time-dependent dielectric breakdown. The output impedance may also be improved. Some embodiments include silicide block dielectric material between the gates, reducing the effective doping between the gates and further reducing the maximal drain-side electric field. In some embodiments, the semiconductor device also has a broader safe operating area, and is self-aligned.

Figure 1:
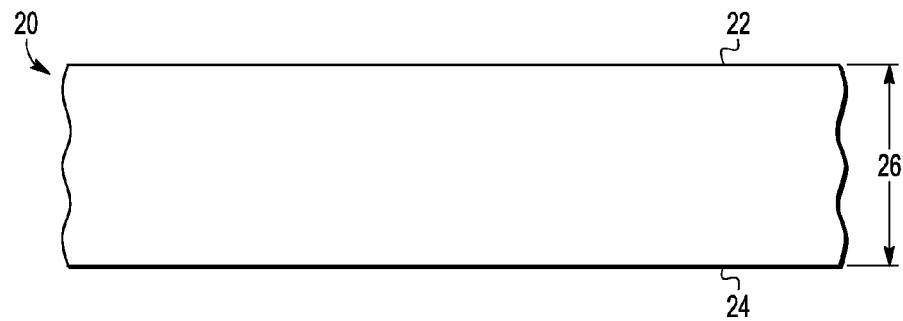
FIG. 1 is a cross-sectional side view of a semiconductor substrate.

FIGS. 1-11 illustrate steps involved in fabricating a multi-gate semiconductor device in accord with embodiments of the present invention. Referring to FIG. 1, there is illustrated a semiconductor substrate 20. The semiconductor substrate 20 is made of a semiconductor material, such as gallium arsenide (GaAs), gallium nitride (GaN), or silicon (Si). The substrate 20 has an upper surface 22, a lower surface 24, and a thickness 26 of, for example, between approximately 300 and 1000 microns. The semiconductor material of the substrate 20 may be of a first conductivity type, or doped with a first dopant type, and may include an upper layer of epitaxial silicon, as is commonly understood in the art. In the example illustrated in FIG. 1, the substrate 20 is a "P-type" semiconductor substrate and is doped with boron (B) to a concentration of, for example, approximately $1.0 \times 10^{15}$ atoms per $cm^3$.

Although only a portion of the semiconductor substrate 20 is illustrated, it should be understood that the substrate 20 may be a semiconductor wafer with a diameter of, for example, approximately 150, 200, or 300 millimeters. Additionally, although not specifically illustrated, the substrate 20 may be divided into multiplies dies, or "dice," as commonly understood in the art. Furthermore, although the following process steps may be shown as being performed on only a small portion of the substrate 20, it should be understood that each of the steps may be performed on substantially the entire substrate 20, or multiple dice, simultaneously. Furthermore, although not shown, it should be understood that the processing steps described below may be facilitated by the deposition and exposure of additional photoresist layers, as is commonly understood.

Figure 2:
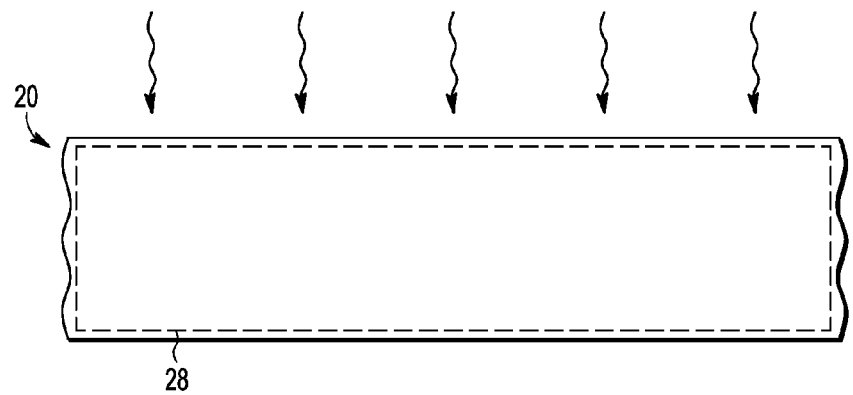
FIG. 2 is a cross-sectional side view of the semiconductor substrate of FIG. 1 undergoing an ion implantation process.

As shown in FIG. 2, a well region 28 is then formed within the substrate 20. In an exemplary embodiment, the well region 28 is formed using ion implantation to have the first conductivity type (e.g. P-type). The well region is, for example, doped with boron to a concentration of between $2.0 \times 10^{16}$ atoms per $cm^3$ and $6.0 \times 10^{17}$ atoms per $cm^3$. Although in the example illustrated in FIG. 2, the well region 28 is shown as covering the entire substrate 20, and as a result is equivalent to the substrate, and is not separately shown in subsequent figures, it should be understood that the well region 28 may only cover discrete portions of the entire substrate 20 and, in one embodiment, has a thickness of approximately 0.5 to 3.0 microns.

Figure 3:
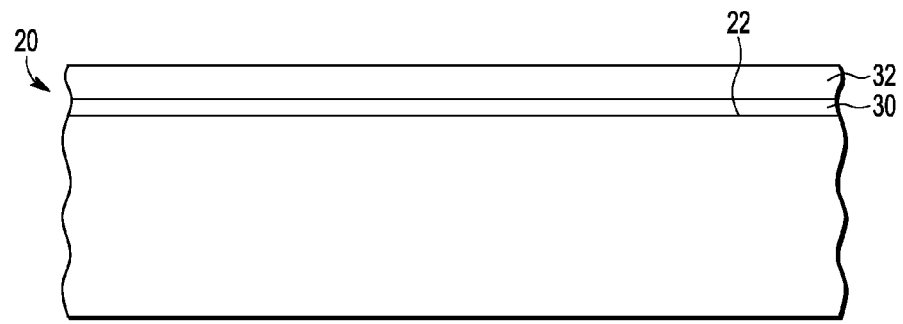
FIG. 3 is a cross-sectional side view of the semiconductor substrate of FIG. 2 with a gate dielectric layer and a gate electrode layer formed thereon.

Referring to FIG. 3, a gate dielectric layer 30 and a gate electrode layer 32 are then formed on the upper surface 22 of the substrate 20. The gate dielectric layer 30 is made of an insulating material, such as silicon oxide, and has a thickness of, for example, between approximately 25 and 400 angstroms. The gate electrode layer 32, in one embodiment, is made of poly-silicon and has a thickness of approximately 0.1 to 0.5 microns. The gate dielectric layer 30 may be formed through, for example, thermal oxidation, and the gate electrode layer 32 may be formed using, for example, chemical vapor deposition (CVD).

Figure 4:
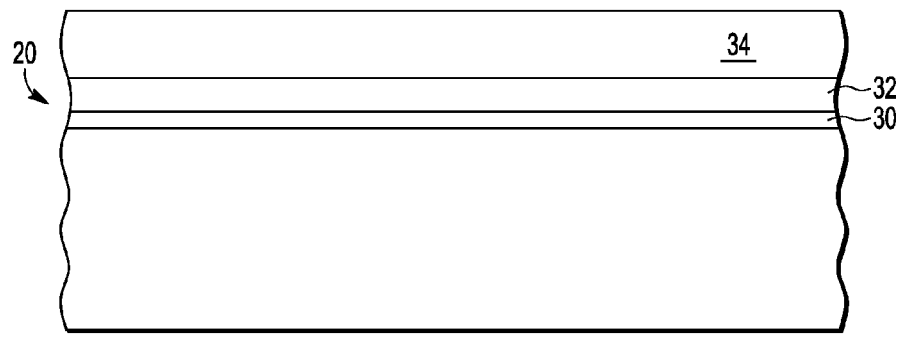
FIG. 4 is a cross-sectional side view of the semiconductor substrate of FIG. 3 with a photoresist layer formed thereon.
Figure 5:
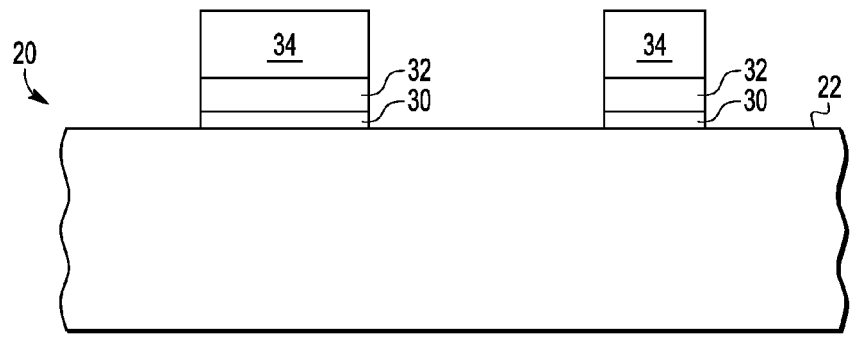
FIG. 5 is a cross-sectional side view of the semiconductor substrate of FIG. 4 after the photoresist layer has been exposed and developed and the gate dielectric layer and the gate electrode layer have been etched to form multiple gate electrode.
Figure 6:
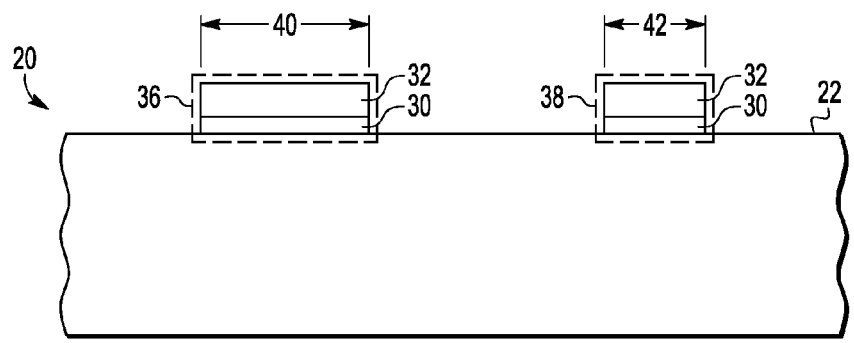
FIG. 6 is a cross-sectional side view of the semiconductor substrate of FIG. 5 after the remainder of the photoresist layer has been removed.

Next, referring to FIGS. 4-6, the gate dielectric layer 30 and the gate electrode layer 32 are patterned and etched. As shown in FIG. 4, a photoresist layer 34 is formed over the gate electrode layer 32 to a thickness of, for example, between 0.2 and 5 microns. The photoresist layer 34 is then selectively exposed and developed to remove portions thereof from over the gate electrode layer 32. The uncovered portions of the gate dielectric layer 30 and the gate electrode layer 32 are then etched to expose specific portions of the upper surface 22 of the substrate 20, as shown in FIG. 5. As illustrated in FIG. 6, the remaining portions of the photoresist layer 34 are then stripped from the gate electrode layer 32. As shown, after the photoresist is stripped, a first gate formation 36 and a second gate formation 38 remain on the upper surface of the substrate 20. Both the first gate formation 36 and the second gate formation 38 include a portion of the gate dielectric layer 30 (i.e. a gate dielectric) and a portion of the gate electrode layer 32 (i.e. a gate electrode).

In one embodiment, the first gate formation 36 has a length 40 that is at least 50% greater than a length 42 of the second gate formation 38. In one embodiment, the length 40 of the first gate formation 36 is between 0.1 and 1.0 microns, and the length 42 of the second gate formation 38 is between 0.05 and 0.6 microns. The length 42 of the second gate formation 38 may correspond to the size of the smallest possible feature (e.g. 0.13 microns) using current complementary metal oxide semiconductor (CMOS) processing steps, as will be appreciated by one skilled in the art. Although not specifically illustrated, the first gate formation 36 and the second gate formation 38 may be connected outside the "active area," as is commonly understood, using either poly lines or contact/metal lines. In addition, the first gate formation 36 is spaced or separated from the second gate formation 38 by a distance, wherein the distance is selected according to the requirements of a given multi-gate semiconductor device implementation. When in operation, voltages applied to each gate electrode layer may act across the gate dielectric layers to produce electric fields as set forth in further detail below; the variance of size between the first gate 36 and the second gate 38 may confer advantages in reliability and HCI prevention as described in further detail below. In some embodiments, the first gate formation 36 and second gate formation 38 act together in an analogous manner to a gate on a conventional MOSFET.

Figure 7:
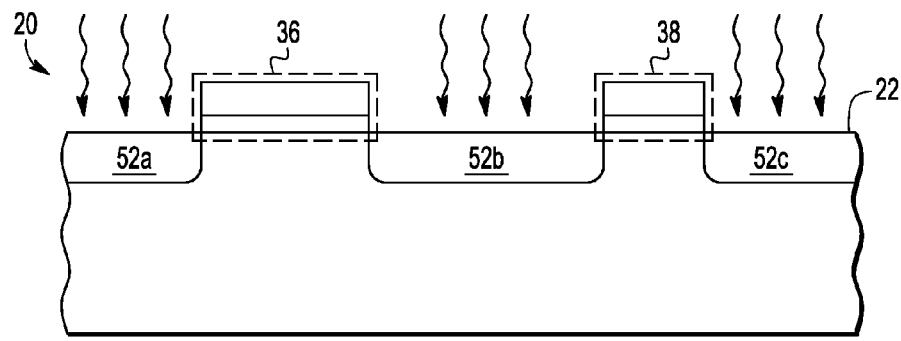
FIG. 7 is a cross-sectional side view of the semiconductor substrate of FIG. 6 undergoing an ion implantation process to form a plurality of lightly-doped drain (LDD) regions.
Figure 8:
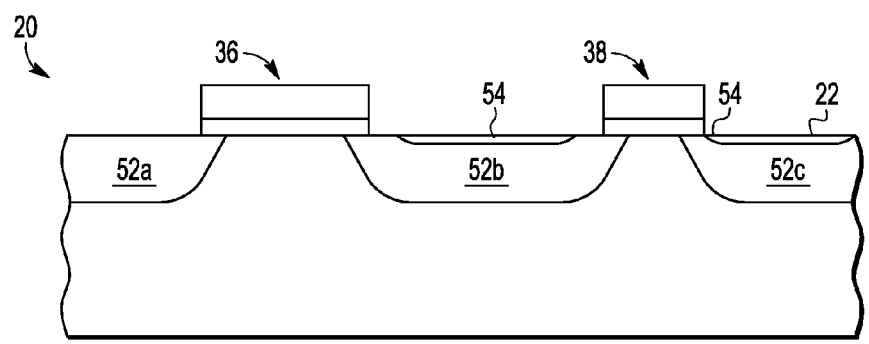
FIG. 8 is a cross-sectional side view of the semiconductor substrate of FIG. 7 with lightly-doped pockets of opposite doping type formed on the LDD regions.

As shown in FIG. 7, a plurality of lightly-doped regions 52*a-c* are then formed within the upper surface 22 of the substrate 20. As shown, the lightly-doped regions 52*a-c* are formed on opposing sides of each of the first and second gate formations 36 and 38 and completely cover the area therebetween, creating a first portion 52*b* between the first and second gate formations 36 and 38 and a source portion 52*a* and drain portion 52*c* on the opposite sides of the first 36 and second 38 gate formations, respectively, from the first portion 52*b*. The lightly-doped regions 52*a-b* are formed using, for example, ion implantation and doped to have a second conductivity type (e.g. N-type lightly-doped drain (NLDD) implants) with phosphorous to a concentration of, for example, between $1.0 \times 10^{16}$ atoms per $cm^3$ and $8.0 \times 10^{18}$ atoms per $cm^3$. As shown in FIG. 8, during the implantation process and the thermal cycles afterwards, the lightly-doped regions diffuse laterally beneath the edges of the first and second gate formations 36 and 38.

Still referring to FIG. 8, after the formation of the lightly-doped regions 52*a-b*, pockets 54 of lightly-doped drain implants are formed in at least one of the lightly-doped regions 52*a-b*. The pockets 54 may be formed in the first portion 52*b* between the first and second gate formations 36 and 38 and on the drain side 52c of the second gate formation 38. The pockets 54 are formed using, for example, ion implantation and doped to have the first conductivity type (e.g. P-type lightly-doped drain (PLDD) which is used for PMOS devices) implants with boron to a concentration of, for example, between $0.5 \times 10^{16}$ atoms per $cm^3$ and $6.0 \times 10^{18}$ atoms per $cm^3$. The concentration of dopants in the pockets 54 may be lower than in the lightly-doped regions; for instance, the concentration of dopant used in the pockets 54 may be approximately half that used for the lightly-doped regions 52a-c. The pockets 54 may be shallower than the lightly-doped regions 52a-c. In some embodiments, the pockets 54 are formed in a region doped with both the second dopant and the first dopant, having a higher surface dopant concentration of the first dopant resulting in a shallow pocket near the surface of the substrate having a net first dopant prevalence, while the net dopant concentration of regions 52a-c outside of the pockets 54 has predominantly the second dopant type.

Figure 9:
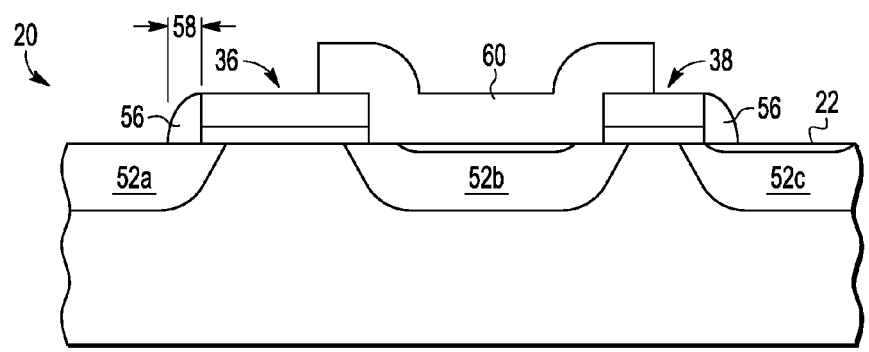
FIG. 9 is a cross-sectional side view of the semiconductor of FIG. 8 with spacers formed on the gate electrodes and a silicide block dielectric material formed between the gate electrodes.

Referring to FIG. 9, spacers 56 are formed at the outer edges of the gate formations 36 and 38. The spacers 56 may be made of silicon nitride or silicon oxide and formed using a blanket deposition process followed by an anisotropic etch, as is commonly understood. The spacers 56 have, for example, widths 58 of between 0.03 and 0.15 microns.

Still referring to FIG. 9, a block 60 is formed between the first and second gate formations 36 and 38. The block 60 may be formed from a dielectric substance, such as silicon nitride, silicon oxide, or a combination of silicon nitride and silicon oxide; for instance, a layer of silicon oxide may be deposited first, followed by a layer of silicon nitride. The block 60 may be formed using a blanket deposition process such as CVD or plasma-enhanced CVD (PECVD), followed by an anisotropic etch, as is commonly understood. The block 60 may include a layer of silicon oxide having a thickness between 100 and 200 Angstroms. The block 60 may include a layer of silicon nitride having a thickness between 450 and 1450 Angstroms. The block may overlap the first gate electrode 36 and second gate electrode 38; in some embodiments, each electrode 36, 38 has an upper surface opposite the substrate 20, and overlapping the first electrode 36 or second electrode 38 is accomplished by covering a piece of the upper surface. The lateral overlap range of the block 60 may cover between 0.005 microns and 0.2 microns of the upper surface of each gate electrode; the portion of each gate electrode covered by the overlap of the block 60 may be adjacent to the gap between the electrodes 36, 38 occupied by the block 60.

Figure 10:
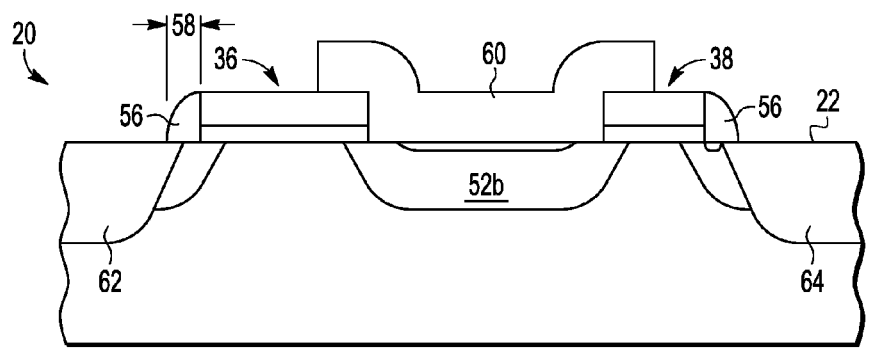
FIG. 10 is a cross-sectional side view of the semiconductor substrate of FIG. 9 with a source region and a drain region, formed thereon thus forming a semiconductor device according to one embodiment of the present invention.

Referring now to FIG. 10, an additional regions 62 and 64 are then formed within the upper surface 22 of the substrate 20 to create a source region including the lightly-doped portion 52a and the newly-formed portion 62 and a drain region including the lightly-doped portion 52c and the newly-formed portion 64 are then. The additional regions 62 and 64 may be formed using ion implantation and have N-type conductivity, being doped with phosphorous and/or arsenic to a concentration of, for example, between $1.0 \times 10^{19}$ atoms per $cm^3$ and $1.0 \times 10^{21}$ atoms per $cm^3$.

As shown, the additional region 62 in the source region is formed over the lightly-doped region 52a adjacent to the first gate formation 36, and the additional region 64 in the drain region is formed over the lightly-doped region 52c adjacent to the second gate formation 38. The lightly-doped region 52b between the gate formations 36 and 38 and the pockets 54 are protected by the silicide block dielectric material 60 and the spacers 56, respectively, from the doping process that produces the source region 62 and the drain region 64, so that the pockets 54 and lightly doped region 52b between the gate formations 36 and 38 are largely left unchanged. As will be appreciated by one skilled in the art, the regions 62 and 64 laterally diffuse beneath the spacers 56. However, the spacers 56 prevent the regions 62 and 64 from diffusing beneath the gate formations 36 and 38. As such, the channels under the gate formations 36 and 38 are each separated from the respective regions 62 and 64 by a portion of one of the lightly-doped regions 52a-c, as well as the pocket 54 between the first and second gate formations 36 and 38 and on the drain side of the gate formation 38. The regions 62 and 64, in one embodiment, have a thickness of between 0.1 and 2 micron.

The formation of the regions 62 and 64 in the source and drain regions, respectively, may substantially complete the formation of a dual gate transistor or device. However, as will be appreciated by one skilled in the art, although not shown, other components, such as well regions and other contact regions, may be included in the formation of the device.

Figure 11:
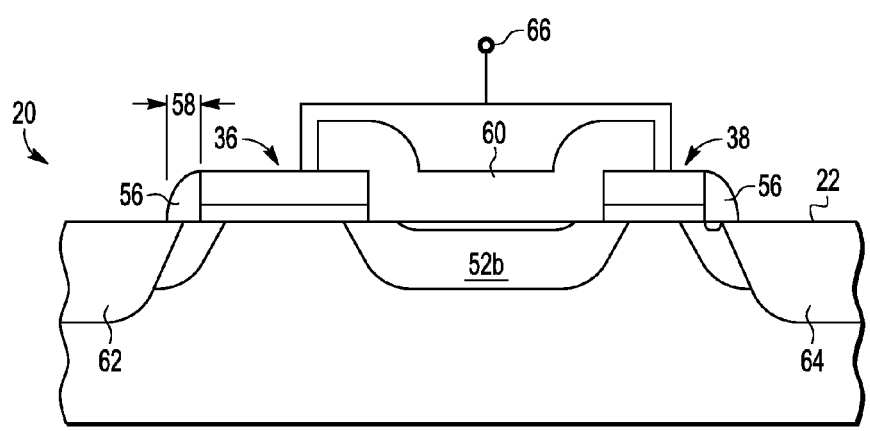
FIG. 11 is a cross-sectional side view of the semiconductor device of FIG. 10 schematically illustrating electrical connections made thereto.

Final processing steps may include the formation of various insulating layers and conductive traces and contacts (e.g. backend processing) over the device to form electrical connections 66 to the first and second gate formations 36 and 38 and the source 62 and 52a and drain regions 64 and 52c, as illustrated in FIG. 11. The substrate 20 may then be sawed into individual microelectronic dice, or semiconductor chips, packaged, and installed in various electronic or computing systems.

Still referring to FIG. 11, in an exemplary embodiment, during operation, the source region 62 is grounded and an operational voltage (e.g. approximately 6V) is applied to the drain region 64 and 52c. The first gate 36 serves as a channel region for the device, and the second gate 38 serves as an extended drain, thus reducing the maximum electric field experienced by the gates 36 and 38. That is, the load of the operational voltage is spread between the first gate 36 and the second gate 38, and as a result, the adverse effects from hot carrier injection (HCI) are reduced.

Figure 12:
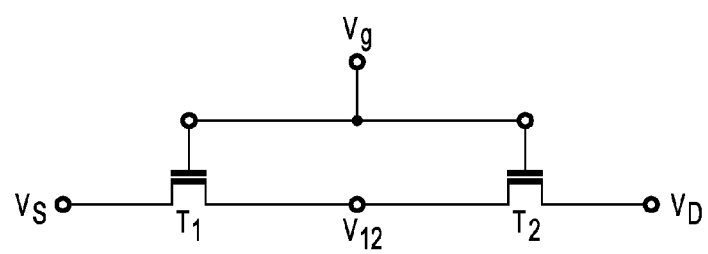

To illustrate the operation of the dual gate structure more clearly, the structure may be considered to include two NMOS transistors $T_1$ and $T_2$, which are connected in series with a common gate voltage $V_g$, as shown in FIG. 12. The first transistor $T_1$ represents the portion of the structure with the first gate 36 (i.e., the channel region with a higher threshold voltage ($V_t$)). The threshold voltage of the first transistor $T_1$ (i.e., $V_{t1}$) is, for example, between 0.5 and 0.8 V. The second transistor $T_2$ represents the portion of the structure with the second gate 38 (i.e., the channel region with a lower threshold voltage). The threshold voltage of the second transistor $T_2$ (i.e., $V_{t2}$) is, in one embodiment, between −0.1 and 0.1 V.

The threshold voltage for the second transistor $T_2$ may be made negative by creating an extremely short gate length for the second gate 38. During the formation of the lightly-doped regions 52 as shown in FIGS. 7 and 8, the lightly-doped regions 52 can diffuse laterally under both sides of the second gate 38. Since the gate length 42 of the second gate 38 is very small, the lightly-doped regions 52b and 52c on both sides of the second gate 38 can be formed such that the regions 52b-c nearly contact each other and form a so called "depletion mode NMOS," which has a negative threshold voltage and can only be shut off when the gate voltage $V_g$, as shown in FIG. 12, is negative, as is commonly understood.

The two-transistor model can be further simplified as two variable resistors $R_{T1}$ and $R_{T2}$ connected in series, as shown in FIG. 13. The value of the first resistor $R_{T1}$ is determined by the gate overdrive from the first gate 36 (i.e. $T_1$), which is the difference between the gate voltage and its threshold voltage (i.e. $V_g-V_{t1}$). Similarly, the value of the second resistor $R_{T2}$ depends on the gate overdrive from the second gate 38 (i.e., $T_2$), which is $V_g-V_{t2}-V_{12}$, where $V_{12}$ is the "floating voltage" on the region between the first gate 36 and the second gate 38. The higher the gate overdrive, the lower the resistance for the first resistor $R_{T1}$ or the second resistor $R_{T2}$.

For very low drain voltage ($V_D$) biases, (e.g. $V_D$=0.1V), because $V_{12}$ (i.e., the drain bias for $T_1$) is very small ($V_{12}<V_D$=0.1V), it is expected that the gate overdrive from the first gate 36 will be substantially less than the gate overdrive from the second gate 38 (i.e., $V_g-V_{t1} \ll V_g-V_{t2}-V_{12}$ because $V_{t1} \gg V_{t2}$) so that the value of the first resistor $R_{T1}$ is substantially greater than the value of the second resistor $R_{T2}$ (i.e., $R_{T1} > R_{T2}$). In such a case, the first transistor $T_1$ has a greater voltage drop than the second transistor $T_2$. When the drain voltage increases, the floating voltage $V_{12}$ should increase accordingly. When the elevated drain voltage increases to a point such that the overdrives for $T_1$ and $T_2$ become comparable (i.e., $V_g-V_{t1} \sim V_g-V_{t2}-V_{12}$), then the values of the resistors could approximately equalize (i.e., $R_{T1} \sim R_{T2}$), as should the voltage drops in $T_1$ and $T_2$. As the drain voltage is raised further, so is the floating voltage $V_{12}$, and the overdrive voltages begin to reverse (i.e. switch from $V_g-V_{t1} < V_g-V_{t2}-V_{12}$ to $V_g-V_{t1} > V_g-V_{t2}-V_{12}$).

As such, the values of the two resistors $R_{T1}$ and $R_{T2}$ eventually reverse from $R_{T1} > R_{T2}$ to $R_{T1} < R_{T2}$. When this occurs, there is more voltage dropped in the second transistor $T_2$ than in the first transistor $T_1$. Therefore, the second transistor $T_2$, or more specifically the second gate 38, serves as a protective device that limits the actual voltage drop on the first gate 36 (or the first transistor $T_1$) when the supplied drain voltage is higher. The sharing of the drain voltage bias between the first and second transistors $T_1$ and $T_2$ can reduce the electrical field in the gates of 36 and 38, so that the severe HCI damage can be reduced.

At relatively high drain voltage (e.g. approximately 6V), the HCI degradation is more severe and further improvement is required. This is achieved by the pocket implant 54 and the silicide block material 60. The pockets 54 have the opposite conductance from the channel. As a result, an additional depletion region is created which helps further reduce the maximum drain-side electric field and thus further improves the HCI immunity. Another result of the inclusion of the pockets 54 is the voltage at the drain side gate edge is reduced in blocking state and so the accumulation mode time-dependent dielectric breakdown (TDDB) is improved. This design also improves the output impedance of the semiconductor device.

The silicide block dielectric material 60 reduces the effective doping between the first gate 36 and the second gate 38 and thus reduces the electric field at the drain side. So the HCI degradation is further reduced. The block 60 also improves the reliability of the manufacturing process, by ensuring that unpredictable amounts of the heavier doping required to create the source region 62 and 52a and drain region 64 and 52c in some embodiments are not introduced between the first and second gate electrodes 36 and 38. The greater predictability of the manufacturing process also results in more predictable parametric behavior in the assembled semiconductor device.

In addition to minimizing the HCI degradation, improving accumulation mode TDDB, and improving the output impedance, this device also exhibits much better safe operating area than conventional extended drain structures. Another advantage is that because the structure of the device is self-aligned, the matching performance of the device is improved. A further advantage is that the saturation current of the transistor is increased, as the saturation current is mainly determined by the length of the first gate which can be very small (e.g. 0.2 micron) without the device being damaged by HCI. Therefore, the overall size of the device is effectively decreased. A yet further advantage is that the transistor may be constructed using standard complementary metal oxide semiconductor (CMOS) processing steps, without requiring additional mask or otherwise increasing the process complexity, and thus avoiding increases in manufacturing costs.

FIG. 14 illustrates a method 1400 for manufacturing a semiconductor device. The method includes forming, on the upper surface of a substrate having a first dopant type, a first gate electrode and a second gate electrode (1401); this may be implemented as described above in connection with FIGS. 1-13. The method includes forming a first region of a second dopant type in the upper surface of the substrate between and partially underlying the first and second gate electrodes, the first region having a first dopant concentration (1402); this may be implemented as described above in connection with FIGS. 1-13. The method includes forming a first pocket of the first dopant type in the first region, the first pocket being spaced apart from the first and second gate electrodes and having a second dopant concentration (1403); this may be implemented as described above in connection with FIGS. 1-13.

The method may include forming a second pocket of the first dopant material in the drain region, the second pocket being spaced apart from the second gate electrode and having a fourth dopant concentration (1404); this may be accomplished as described above in connection with FIGS. 1-13. The method may further include depositing a block of dielectric material between the first gate electrode and the second gate electrode (1405). In some embodiments, the block of dielectric material is deposited as disclosed above in reference to FIGS. 1-13. The method may include forming a source region of the second dopant type adjacent to the first electrode and a drain region of the second dopant type adjacent to the second electrode in the upper surface of the substrate, the source region and the drain region having a third dopant concentration. In some embodiments, the source and drain region are formed as described above in reference to FIGS. 1-13.

Other embodiments may utilize different sizes and/or numbers of gate electrodes than those described above. The device may also be constructed with the first and second gate electrodes having approximately the same width or with the second gate electrode being wider than the first gate electrode. Different dopants and different concentrations of dopants may be used, as is commonly understood. Although the description above refers to P-type as being the first dopant and conductivity type and N-type as being the second dopant and conductivity type, it should be understood that the dopant types of the various regions may be switched, as is commonly understood in the art.

As will be appreciated, embodiments as disclosed include at least the following. In one embodiment, a semiconductor device includes a substrate having a first dopant type. The semiconductor device includes a first gate electrode formed over the substrate. The semiconductor device includes a second gate electrode formed over the substrate and spatially separated from the first gate electrode. The semiconductor device includes a first region of a second dopant type formed in the substrate between and partially underlying the first and second gate electrodes, the first region having a first dopant concentration. The semiconductor device includes a first pocket of the first dopant type formed in the first region, the pocket being spaced apart from the first and second gate electrodes and having a second dopant concentration. The semiconductor device includes a source region formed in the semiconductor substrate on an opposing side of the first gate electrode from the first region, the source region having the second dopant type. The semiconductor device includes a drain region formed in the semiconductor substrate on an opposing side of the second gate electrode from the first region, the drain region having the second dopant type.

In alternative embodiments, the device further includes a second pocket of the first dopant type formed in the drain region, the second pocket being adjacent to and spaced apart from the second electrode, the second pocket having a third dopant concentration. The first dopant concentration may be greater than the second dopant concentration and the third dopant concentration. The first dopant type may be P-type and the second dopant type may be N-type. In other embodiments, the device further includes a block of dielectric material between the first gate electrode and the second gate electrode, the block overlapping the first gate electrode and the second gate electrode. The block of dielectric material may also include a layer of silicon nitride. The block of dielectric material may additionally include a layer of silicon oxide. The block of dielectric material may further include a combination of silicon nitride and silicon oxide. In some embodiments, the device includes a dual gate MOS transistor, wherein the first gate electrode serves as a channel region and the second gate electrode serves as an extended drain. The extended drain may be lightly doped. In some embodiments, the device includes a gate dielectric formed between each of the first and second gate electrodes and the substrate.

In another embodiment, a semiconductor device includes a substrate having a first dopant type. The semiconductor device includes a first gate electrode formed over the substrate. The semiconductor device includes a second gate electrode formed over the substrate and spatially separated from the first gate electrode, wherein the first gate electrode has a first length and the second gate electrode has a second length, the second length being substantially different from the first length. The semiconductor device includes a first region of a second dopant type formed in the substrate between and partially underlying the first and second gate electrodes, the first region having a first dopant concentration. The semiconductor device includes a first pocket of the first dopant type formed in the first region, the pocket being spaced apart from the first and second gate electrodes and having a second dopant concentration. The semiconductor device includes a source region formed in the semiconductor substrate on an opposing side of the first gate electrode from the first region, the source region having the second dopant type. The semiconductor device includes a drain region formed in the semiconductor substrate on an opposing side of the second gate electrode from the first region, the drain region having the second dopant type.

In additional embodiments, the first length is greater than the second length. The first length may be at least 50 percent greater than the second length. The second length may be less than 0.2 microns. The device may further include a second pocket of the first dopant type formed in the drain region, the second pocket being adjacent to and spaced apart from the second electrode, the second pocket having a third dopant concentration. In some embodiments, the device also includes a block of dielectric material between the first gate electrode and the second gate electrode, the block overlapping the first gate electrode and the second gate electrode.

In an alternative embodiment, a method for manufacturing a semiconductor device includes forming, on the upper surface of a substrate having a first dopant type, a first gate electrode and a second gate electrode. The method includes forming a first region of a second dopant type in the upper surface of the substrate between and partially underlying the first and second gate electrodes, the first region having a first dopant concentration. The method includes forming a first pocket of the first dopant type in the first region, the first pocket being spaced apart from the first and second gate electrodes and having a second dopant concentration.

In an alternative embodiment, the method includes depositing a block of dielectric material between the first gate electrode and the second gate electrode and forming a source region of the second dopant type adjacent to the first electrode and a drain region of the second dopant type adjacent to the second electrode in the upper surface of the substrate, the source region and the drain region having a third dopant concentration. In another embodiment, the method also includes forming a second pocket of the first dopant material in the drain region, the second pocket being spaced apart from the second gate electrode and having a fourth dopant concentration.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

The foregoing detailed description is merely exemplary in nature and is not intended to limit the invention or application and uses of the invention. Furthermore, there is no intention to be bound by any expressed or implied theory presented in the preceding technical field, background, brief summary, or the following detailed description.

What is claimed is:

1. A semiconductor device comprising:
a substrate having a first dopant type;
a first gate electrode formed over the substrate;

a second gate electrode formed over the substrate and spatially separated from the first gate electrode;

a first region of a second dopant type formed in the substrate between and partially underlying the first and second gate electrodes, the first region having a first dopant concentration;

a first pocket of the first dopant type formed in the first region, the pocket being spaced apart from the first and second gate electrodes and having a second dopant concentration;

a source region formed in the semiconductor substrate on an opposing side of the first gate electrode from the first region, the source region having the second dopant type; and a drain region formed in the semiconductor substrate on an opposing side of the second gate electrode from the first region, the drain region having the second dopant type; and a second pocket of the first dopant type formed in the drain region, the second pocket being adjacent to and spaced apart from the second electrode, the second pocket having a third dopant concentration.

2. The semiconductor device of claim 1, wherein the first dopant concentration is greater than the second dopant concentration and the third dopant concentration.

3. The semiconductor device of claim 1, wherein the first dopant type is P-type and the second dopant type is N-type.

4. The semiconductor device of claim 1, wherein the device further comprises a block of dielectric material between the first gate electrode and the second gate electrode, the block overlapping the first gate electrode and the second gate electrode.

5. The semiconductor device of claim 4, wherein the block of dielectric material further comprises a layer of silicon nitride.

6. The semiconductor device of claim 4, wherein the block of dielectric material further comprises a layer of silicon oxide.

7. The semiconductor device of claim 4, wherein the block of dielectric material further comprises a combination of silicon nitride and silicon oxide.

8. The semiconductor device of claim 1, wherein the device comprises a dual gate MOS transistor, wherein the first gate electrode serves as a channel region and the second gate electrode serves as an extended drain.

9. The semiconductor device of claim 8 wherein the extended drain is lightly doped.

10. The semiconductor device of claim 1, further comprising a gate dielectric formed between each of the first and second gate electrodes and the substrate.

11. A semiconductor device comprising:
a substrate having a first dopant type;
a first gate electrode formed over the substrate;
a second gate electrode formed over the substrate and spatially separated from the first gate electrode, wherein the first gate electrode has a first length and the second gate electrode has a second length, the second length being substantially different from the first length;

a first region of a second dopant type formed in the substrate between and partially underlying the first and second gate electrodes, the first region having a first dopant concentration;

a first pocket of the first dopant type formed in the first region, the pocket being spaced apart from the first and second gate electrodes and having a second dopant concentration;

a source region formed in the semiconductor substrate on an opposing side of the first gate electrode from the first region, the source region having the second dopant type;

a drain region formed in the semiconductor substrate on an opposing side of the second gate electrode from the first region, the drain region having the second dopant type; and a second pocket of the first dopant type formed in the drain region, the second pocket being adjacent to and spaced apart from the second electrode, the second pocket having a third dopant concentration.

12. The semiconductor device of claim 11, wherein the first length is greater than the second length.

13. The semiconductor device of claim 12, wherein the first length is at least 50 percent greater than the second length.

14. The semiconductor device of claim 12, wherein the second length is less than 0.2 microns.

15. The semiconductor device of claim 11, wherein the device further comprises a block of dielectric material between the first gate electrode and the second gate electrode, the block overlapping the first gate electrode and the second gate electrode.

16. A method for manufacturing a semiconductor device, the method comprising:
forming, on the upper surface of a substrate having a first dopant type, a first gate electrode and a second gate electrode;

forming a first region of a second dopant type in the upper surface of the substrate between and partially underlying the first and second gate electrodes, the first region having a first dopant concentration;

forming a first pocket of the first dopant type in the first region, the first pocket being spaced apart from the first and second gate electrodes and having a second dopant concentration;

depositing a block of dielectric material between the first gate electrode and the second gate electrode;

forming a source region of the second dopant type adjacent to the first electrode and a drain region of the second dopant type adjacent to the second electrode in the upper surface of the substrate, the source region and the drain region having a third dopant concentration; and forming a second pocket of the first dopant material in the drain region, the second pocket being spaced apart from the second gate electrode and having a fourth dopant concentration.

* * * * *